United States Patent
Catabay et al.

(10) Patent No.: US 6,503,840 B2
(45) Date of Patent: Jan. 7, 2003

(54) PROCESS FOR FORMING METAL-FILLED OPENINGS IN LOW DIELECTRIC CONSTANT DIELECTRIC MATERIAL WHILE INHIBITING VIA POISONING

(75) Inventors: Wilbur G. Catabay, Saratoga, CA (US); Wei-Jen Hsia, Sunnyvale, CA (US); Hong-Qiang Lu, Fremont, CA (US); Yong-Bae Kim, Cupertino, CA (US); Kiran Kumar, Sunnyvale, CA (US); Kai Zhang, Saratoga, CA (US); Richard Schinella, Saratoga, CA (US); Philippe Schoenborn, San Mateo, CA (US)

(73) Assignee: LSI Logic Corporation, Milpitas, CA (US)

( * ) Notice: Subject to any disclaimer, the term of this patent is extended or adjusted under 35 U.S.C. 154(b) by 69 days.

(21) Appl. No.: 09/848,758

(22) Filed: May 2, 2001

(65) Prior Publication Data

US 2002/0164877 A1 Nov. 7, 2002

(51) Int. Cl.$^7$ .............................................. H01L 21/302
(52) U.S. Cl. ....................... 438/694; 438/699; 438/700; 438/702; 438/709; 438/718; 438/725
(58) Field of Search ................................. 438/694, 699, 438/700, 702, 709, 718, 725

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |

(List continued on next page.)

FOREIGN PATENT DOCUMENTS

| | | | |
|---|---|---|---|
| EP | 0 706 216 A2 | 4/1996 | ......... H01L/23/532 |
| EP | 0 949 663 A2 | 10/1999 | ......... H01L/21/312 |
| JP | 63003437 | 1/1988 | ........... H01L/21/90 |
| JP | 2000-267128 | 9/2000 | ........... G02F/1/136 |
| WO | WO 99/41423 | 8/1999 | |

OTHER PUBLICATIONS

Sugahara, Satoshi, et al., "Chemical Vapor Deposition of CF$_3$ –Incorporated Silica Films for Interlayer Dielectric Application", 1999 Joint International Meeting, *Electrochemical Society Meeting Abstracts*, vol. 99–2, 1999, Abstract No. 746.

(List continued on next page.)

*Primary Examiner*—Benjamin L. Utech
*Assistant Examiner*—Binh X. Tran
(74) *Attorney, Agent, or Firm*—John P. Taylor

(57) ABSTRACT

A composite layer of dielectric material is first formed over the integrated circuit structure, comprising a thin barrier layer of dielectric material, a layer of low k dielectric material over the barrier layer, and a thin capping layer of dielectric material over the layer of low k dielectric material. A photoresist mask, formed over the capping layer, is baked in the presence of UV light to cross-link the mask material. The composite layer is then etched through the resist mask using an etchant gas mixture including CO, but not oxygen. Newly exposed surfaces of low k dielectric material are then optionally densified to harden them. The resist mask is then removed using a plasma of a neutral or reducing gas. Exposed surfaces of low k dielectric material are then passivated by a low power oxygen plasma. Preferably, optional densification, mask removal, and passivation are all done in the same vacuum apparatus. The substrate is then solvent cleaned to remove etch residues and then annealed to degasify the low k dielectric material. The substrate is then RF cleaned and a thin layer of PVD titanium is then formed in the same chamber over the surfaces of the openings. CVD titanium nitride is then formed over the titanium in the same vacuum apparatus. The coated openings are then filled with aluminum, tungsten, or copper.

20 Claims, 1 Drawing Sheet

U.S. PATENT DOCUMENTS

| | | | | |
|---|---|---|---|---|
| 4,705,725 | A | 11/1987 | Glajch et al. | 428/405 |
| 4,771,328 | A | 9/1988 | Malaviya et al. | 357/49 |
| 5,194,333 | A | 3/1993 | Ohnaka et al. | 428/405 |
| 5,314,845 | A | 5/1994 | Lee et al. | 437/238 |
| 5,364,800 | A | 11/1994 | Joyner | 437/28 |
| 5,376,595 | A | 12/1994 | Zupancic et al. | 501/12 |
| 5,470,801 | A | 11/1995 | Kapoor et al. | 437/238 |
| 5,558,718 | A | 9/1996 | Leung | 118/723 E |
| 5,559,367 | A | 9/1996 | Cohen et al. | 257/77 |
| 5,580,429 | A | 12/1996 | Chan et al. | 204/192.38 |
| 5,628,871 | A | 5/1997 | Shinagawa | 438/514 |
| 5,675,187 | A | 10/1997 | Numata et al. | 257/758 |
| 5,688,724 | A | 11/1997 | Yoon et al. | 437/235 |
| 5,858,879 | A | 1/1999 | Chao et al. | 438/725 |
| 5,864,172 | A | 1/1999 | Kapoor et al. | 257/634 |
| 5,874,367 | A | 2/1999 | Dobson | 438/787 |
| 5,874,745 | A | 2/1999 | Kuo | 257/59 |
| 5,882,489 | A | 3/1999 | Bersin et al. | 204/192.35 |
| 5,904,154 | A | 5/1999 | Chien et al. | 134/1.2 |
| 5,915,203 | A | 6/1999 | Sengupta et al. | 438/669 |
| 5,939,763 | A | 8/1999 | Hao et al. | 257/411 |
| 6,025,263 | A | 2/2000 | Tsai et al. | 438/624 |
| 6,028,015 | A | 2/2000 | Wang et al. | 438/789 |
| 6,037,248 | A | 3/2000 | Ahn | 438/619 |
| 6,043,167 | A | 3/2000 | Lee et al. | 438/789 |
| 6,051,073 | A | 4/2000 | Chu et al. | 118/723 |
| 6,051,477 | A | 4/2000 | Nam | 438/404 |
| 6,066,574 | A | 5/2000 | You et al. | 438/781 |
| 6,114,259 | A | 9/2000 | Sukharev et al. | 438/789 |
| 6,147,012 | A | 11/2000 | Sukharev et al. | 438/787 |
| 6,153,524 | A | 11/2000 | Henley et al. | 438/691 |
| 6,204,192 | B1 | 3/2001 | Zhao et al. | 438/723 |
| 6,232,658 | B1 | 5/2001 | Catabay et al. | 257/701 |
| 6,323,121 | B1 * | 11/2001 | Liu et al. | 438/633 |
| 6,358,842 | B1 * | 3/2002 | Zhou et al. | 438/596 |
| 6,372,636 | B1 * | 4/2002 | Chooi et al. | 438/639 |
| 6,376,353 | B1 * | 4/2002 | Zhou et al. | 438/612 |

OTHER PUBLICATIONS

Bothra, S., et al., "Integration of 0.25 µm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low-k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low-k Dielectric", *Semiconductor International*, vol. 21, No. 10, Sep., 1998, pp. 64–66, 68, 70, 72, and 74.

Koda, Seiichiro, et al., "A Study of Inhibition Effects for Silane Combustion by Additive Gases", *Combustion and Flame*, vol. 73, No. 2, Aug., 1988, pp. 187–194.

* cited by examiner

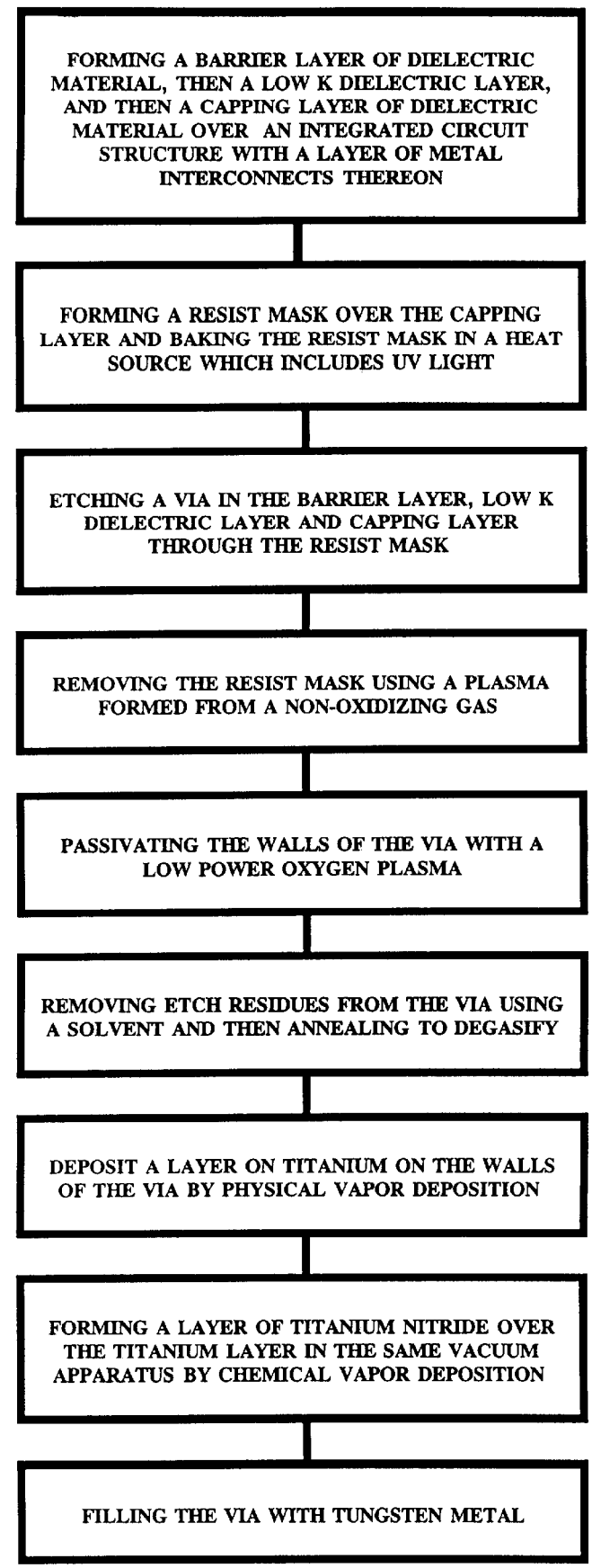

PROCESS FOR FORMING METAL-FILLED OPENINGS IN LOW DIELECTRIC CONSTANT DIELECTRIC MATERIAL WHILE INHIBITING VIA POISONING

BACKGROUND OF THE INVENTION

1. Field of the Invention

This invention relates to a process for forming integrated circuit structures. More particularly, this invention relates to a process for forming metal-filled openings in a layer of low dielectric constant (low k) dielectric material in an integrated circuit structure.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Flowfill process.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The incorporation of such carbon-doped silicon oxide dielectric material into interconnect architecture has been very attractive not only because of the low k properties, but also because of the compatibility with conventional silicon process technologies. Generally these materials remain stable upon annealing at temperatures of up to 500° C. The carbon doped silicon oxide materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

However, when trenches and holes (such as vias and contact openings) are etched into dielectric films or layers, the resulting etched surfaces are exposed to atmospheric contaminants such as, for example, oxygen, nitrogen, rare gases, hydrocarbons, and water vapor which tend to be attracted to such surfaces. In the case of low dielectric constant (low k) materials, which tend to be porous in nature, the adsorption of such contaminants is greater. This is apparently due to a combination of effects including the stripping of weakly bound chemical radicals from the glass matrix that gave rise to the porosity. This is the case, for instance, in low k silicon oxide dielectric materials that achieved their low dielectric constant through the incorporation into the silicon oxide matrix of weakly bonded organic groups such as methyl groups, which effectively lowered the density of the low k dielectric silicon oxide material to achieve the desired low dielectric constant of the material.

Such organic groups are easily removed from the silicon oxide matrix during plasma etching and cleaning operations such as used, for example, to etch a hole such as a via in the low k dielectric material through a resist mask, and/or to remove the etch mask, and/or to remove etch residues formed either during etching of the hole or removal of the resist mask. If such newly modified surfaces are exposed to atmospheric contamination, e.g., moisture, there is a tendency for this contamination to replace the organic groups that have been removed (i.e., to fill the empty and/or attractive pores). When these now contaminated surfaces are subsequently put into another deposition system for the purpose of creating a thin diffusion barrier, the newly absorbed contaminants tend to diffuse out of the surface of the low k dielectric material, and interfere with the coating of this same surface by the diffusion barrier material. This causes the formation of porous barriers or otherwise defective barriers that do not exhibit normal barrier properties. For instance, in the case of tungsten plug technologies where a titanium film is first deposited by PVD to create a "glue layer", followed by PVD formation of a TiN diffusion barrier prior to the deposition of the tungsten to fill the hole with a tungsten plug, breakdown of the TiN barrier is frequently observed, as evidenced by the reaction that occurs between the titanium film and the $WF_6$ gas which results in what is commonly referred to as "poisoned vias" or "poisoned plugs".

Various approaches have been explored to attempt to solve this problem of via "poisoning". Zukharev et al. U.S. Pat. No. 6,114,259, assigned to the assignee of this invention, and the subject matter of which is hereby incorporated by reference, teaches treating the etched via sidewalls of the low k carbon-doped silicon oxide dielectric material with a nitrogen plasma, or a nitrogen and oxygen plasma, to densify the exposed low k carbon-doped silicon oxide dielectric material. The Zukharev et al. patent further teaches removal of the photoresist mask used to form the openings with a mild oxidizing agent comprising an $H_2O$ plasma. The $H_2O$ plasma removes the resist mask without damaging the exposed low k carbon-doped silicon oxide dielectric material comprising the sidewalls of the etched via sufficiently to interfere with later filling of the via with an electrically conductive metal filler.

Wang et al. U.S. Pat. No. 6,028,015, also assigned to the assignee of this invention, and the subject matter of which is also hereby incorporated by reference, teaches treating damaged via sidewalls of low k carbon-doped silicon oxide dielectric material with either a hydrogen plasma or a nitrogen plasma to repair the via sidewall surfaces which have been damaged by prior removal of the photoresist mask with a traditional ashing/oxidation process, i.e., an oxygen plasma. Such a treatment with a hydrogen or nitrogen plasma is said to cause the hydrogen or nitrogen to bond to silicon atoms with dangling bonds left in the damaged surface of the low dielectric constant organo silicon oxide insulation layer to replace organo material severed from such silicon atoms at the damaged surface. Absorption of moisture in the damaged surface of the low dielectric constant organo silicon oxide insulation layer, by bonding of such silicon with moisture, is thereby inhibited.

John Hu U.S. patent application Ser. No. 09/428,344, also assigned to the assignee of this invention, and the subject matter of which is also hereby incorporated by reference, discloses a process for removing resist mask material from a protective barrier layer formed over a layer of low k silicon oxide dielectric material. The resist removal process comprises exposing the resist mask material to a hydrogen plasma formed from a source of hydrogen such as ammonia, while maintaining the temperature below about 40° C. to inhibit attack of the low k silicon oxide dielectric material by oxygen released from the decomposition of the resist material.

Catabay et al. U.S. patent application Ser. No. 09/543,412, also assigned to the assignee of this invention, and the subject matter of which is also hereby incorporated by reference, teaches treating damaged surfaces of low k material with carbon-containing gas prior to exposure of the damaged surfaces to atmosphere. Treatment could be after etching an opening such as a via, but prior to removal of resist mask if the substrate will be exposed to atmosphere between the via etch step and the resist removal step.

The use of composite layers of dielectric material have also been proposed. Catabay et al. U.S. patent application Ser. No. 09/426,056, also assigned to the assignee of this invention, and the subject matter of which is also hereby incorporated by reference, discloses the formation of a composite layer of low k silicon oxide dielectric material on an integrated circuit structure having closely spaced apart metal lines thereon. The composite layer of low k silicon oxide dielectric material is formed by depositing, in high aspect ratio regions between closely spaced apart metal lines, a first layer of low k silicon oxide dielectric material exhibiting void-free deposition properties until the resulting deposition of low k silicon oxide dielectric material reaches the level of the top of the metal lines on the oxide layer. A second layer of low k silicon oxide dielectric material, having a faster deposition rate than the first layer, and less susceptible to etch damage, is then deposited over the first layer up to the desired overall thickness of the low k silicon oxide dielectric layer. A via may then be formed down to the metal line which extends only through the second layer of low k material which is less susceptible to etch damage.

It has also been proposed to use resist masks to form hard masks which then permits the resist mask to be removed prior to etching of the low k dielectric material. The low k dielectric material is then etched through the hard mask. Subsequent removal of the hard mask does not result in the same damage to exposed surfaces of the low k dielectric material as does the conventional ashing step to remove the resist mask. Such processes are found in Schinella et al. U.S. patent application Ser. No. 09/607,512, and Wang et al. U.S. patent application Ser. No. 09/607,511, both also assigned to the assignee of this invention, and the subject matter of each of which is also hereby incorporated by reference.

While the above approaches all attempt to remedy the problem of damage to the low k dielectric material, which can result in inferior filling of openings with conductive metal filler materials, i.e., "via poisoning", it has been found that at least some of the proposed solutions do not completely solve the problem and may unduly complicate the issue and even create further difficulties.

It would, therefore, be desirable to provide a composite process for filling openings in low k dielectric material with metal filler materials which process is addressed to solution of various portions of the process contributing to the problem of inferior filling of an opening in low k dielectric material with metal filler materials.

SUMMARY OF THE INVENTION

In accordance with the process of the invention, a composite layer of dielectric material is first formed over the integrated circuit structure, comprising a barrier layer of dielectric material, a layer of low k dielectric material over the barrier layer, and a capping layer of dielectric material over the layer of low k dielectric material.

After formation of the composite dielectric layer, a photoresist mask is photolithographically formed over the capping layer of dielectric material, and the mask is then baked in the presence of UV light to further cure (cross-link) the resist mask material prior to using the resist mask. The composite layer is then etched through the resist mask using an etchant gas mixture which includes a mild oxidizing gas such as CO, rather than $O_2$, to inhibit damage to the newly exposed surfaces of low k dielectric material.

The newly exposed surfaces of the low k dielectric material are then subject to an optional densification step to harden the exposed portions of the low k dielectric material. The resist mask is then removed using a plasma formed from a neutral or reducing gas.

After removal of the resist mask, the exposed surfaces of low k dielectric material are passivated by a low power oxygen plasma to further inhibit damage to the low k dielectric material. In a preferred embodiment, the optional densification step, the resist mask removal step, and the low power oxygen passivation step are all carried out in the same chamber, or at least in separate chamber in the same vacuum system to limit, or preferably eliminate, exposure of the surfaces of low k dielectric material to oxygen or other contaminants such as moisture.

The substrate is then subject to a solvent clean to remove etch residues and, after rinsing, the substrate is placed in an annealing furnace and annealed to degasify the exposed surfaces of low k dielectric materials.

The substrate is then placed in a sputtering chamber and RF cleaned with a cleaning plasma following which a thin layer of an electrically conductive material such as PVD titanium is formed over the surfaces of the etched openings. A CVD layer of titanium nitride is then formed over the titanium layer in another chamber in the same vacuum chamber. The coated openings are then filled with a conductive metal filler material capable of filling the openings such as aluminum, tungsten, or copper.

BRIEF DESCRIPTION OF THE DRAWINGS

The sole FIGURE is a flowsheet illustrating the steps of the process of the invention.

DETAILED DESCRIPTION OF THE INVENTION a. Formation of the Composite Dielectric Layer In accordance with the process of the invention, a barrier layer of dielectric material is first formed over the integrated circuit structure, e.g., over the raised metal lines of a lower metal interconnect layer. Such a barrier layer, which may comprise a layer of any conventionally formed silicon oxide ranging in thickness from at least greater than 50 nanometers (nm) to as thick as about 100 nm, is described more fully in Catabay et al. U.S. patent application Ser. No. 09/605,380, filed Jun. 27, 2000, assigned to the assignee of this invention, and the subject matter of which is hereby incorporated by reference.

A layer of low k dielectric material such as low k carbon-doped silicon oxide dielectric material is then formed over the barrier layer. The term "low k", as used herein, is intended to define a dielectric constant of a dielectric material of 3.5 or less. Preferably, the dielectric constant of a "low k" material will be 3.0 or less, and most preferably will be 2.5 or less. The layer of low k carbon-doped silicon oxide dielectric material may comprise the reaction product of methyl silane ($CH_3SiH_3$) and hydrogen peroxide ($H_2O_2$), as described in the previously cited Peters and McClatchie et al. articles, or it may comprise the reaction product of a mild oxidant such as hydrogen peroxide with the carbon-substituted silane materials disclosed in Aronowitz et al. Ser. No. 09/274,457, filed on Mar. 22, 1999, and assigned to the assignee of this application, the subject matter of which is hereby incorporated by reference.

Also capable of being used as the low k dielectric material is the reaction product of a mild oxidant such as hydrogen peroxide and the organofluoro silanes described in Ser. No. 09/590,310, filed on Jun. 7, 2000, and in Ser. Nos. 09/792,683; 09/792,685; and 09/792,691; all filed on Feb. 23, 2001. All four of these applications relating to the reaction of hydrogen peroxide and organofluoro silanes are assigned to the assignee of this application, and the subject matter of all four applications is hereby incorporated by reference. If desired any of the substituted silanes described above may be blended with other additives to achieve certain properties. For example, one of the substituted silanes may be mixed with unsubstituted silane ($SiH_4$), if desired.

A capping layer of dielectric material is then formed over the layer of low k dielectric material. The capping layer of dielectric material may also comprise a layer of any conventionally formed silicon oxide, and is also more fully described in the aforementioned Catabay et al. Ser. No. 09/605,380.

b. Formation of the Photoresist Mask

After formation of the composite layer comprising the barrier dielectric layer, the low k dielectric layer, and the capping dielectric layer, a photoresist mask is photolithographically formed over the capping layer of dielectric material, using standard photoresist materials available from commercial sources such as, for example, Sumitomo, Shopley, and TOK, which comprise cross-linkable organic materials. In accordance with the invention, the resist mask, after formation, is subject to a baking step in the presence of UV light such as a mercury light capable of emitting light of UV wavelength to further cross-link or cure the resist mask material prior to using the resist mask to form openings in the composite layer of barrier layer, low K layer, and capping layer. The resist mask is preferably baked for a period of at least about 2 minutes at a temperature of at least about 170° C. during which time the resist mask remains immersed in UV light. Higher temperatures and longer anneal times may be used, but should be avoided to conserve the thermal budget.

c. Etching of Openings

The desired openings are then etched in the composite layer through the resist mask using a plasma comprising an etchant gas mixture which includes a mild oxidizing gas such as CO, rather than $O_2$, to inhibit damage to the newly exposed surfaces of low k dielectric material. Other etchant gases which may be used in combination with CO in the etching of openings through low k dielectric materials while minimizing damage to the low k dielectric material include, $C_4F_8$, $N_2$, and Ar. Although the use of oxygen, including $O_2$ and $O_3$ (and any other oxygen-containing gas which will decompose in the plasma to oxygen), is preferably avoided during the etching step to form the openings, a minor amount of such oxygen-containing gases sufficient to passivate the newly etched surfaces could be used, as will be discussed below.

It should be noted that the term "openings", as used herein, is intended to include vias used to electrically connect vertically spaced apart layers of metal interconnects, as well as trenches extending horizontally in one or more dielectric layers such as formed in damascene processes. The term "openings" may further include vertical contact openings formed in a dielectric layer down to the contacts of a passive device such as a capacitor or an active device such as a transistor in the integrated circuit structure. Thus, the terms "holes", "openings", "vias", "trenches", and "contact openings", as used herein, should all be considered to be interchangeable with respect to the process of the invention.

d. Optional Densification of Exposed Surfaces of Low K Dielectric Material

After etching the pattern of openings in the composite layer through the resist mask, the substrate, including the newly exposed surfaces of the layer of low k dielectric material, are optionally subject to a densification step comprising exposure to a nitrogen plasma or a nitrogen plus oxygen plasma to harden the exposed portions of the low k dielectric material. As previously mentioned, such a densification step is more fully described in Zukharev et al. U.S. Pat. No. 6,114,259.

e. Removal of Photoresist Etch Mask

The resist mask is then removed using a neutral or reducing gas plasma, such as an $H_2O$, $H_2$, or $NH_3$ plasma, or mixtures of reducing or neutral gases, i.e., without using an oxygen plasma, to mitigate or inhibit damage to the exposed low k surfaces. Previously discussed John Hu U.S. patent application Ser. No. 09/428,344, teaches exposing the resist mask material to a hydrogen plasma formed from a source of hydrogen such as ammonia, while maintaining the temperature below about 40° C. to inhibit attack of the low k silicon oxide dielectric material by oxygen released from the decomposition of the resist material. The use of an $H_2O$ plasma to remove the resist mask while mitigating damage to the low k dielectric material is described in the aforementioned Zukharev et al. U.S. Pat. No. 6,114,259.

f. Passivation of Exposed Surfaces of Low K Dielectric Material

After removal of the resist mask, the exposed surfaces of low k dielectric material are passivated by a low power (low wattage) oxygen plasma ranging in power from about 200 watts to about 1000 watts. The passivation is carried out for a short period of time of from about 10 seconds to about 2 minutes to further inhibit damage to the low k dielectric material. The pressure in the passivation chamber should be maintained between about 1 millitorr and about 150 millitorr during the passivation step, while the temperature of the substrate during the passivation step should be maintained within the range of from about 10° C. to about 70° C. The desired low concentration of oxygen within the passivation chamber during the passivation step may be maintained by flowing into the passivation chamber a source of oxygen in an amount equivalent to flowing into a 10 liter chamber from about 50 standard cubic centimeters per minute (sccm) of a source of oxygen to about 1000 sccm of a source of oxygen, In a preferred embodiment, the optional densification step, the resist mask removal step, and the low power oxygen passivation step are all carried out in the same chamber, or at least in separate chambers in the same vacuum system to limit, or preferably eliminate, exposure of the surfaces of low k dielectric material to oxygen or other contaminants such as moisture.

g. Cleaning and Degasification of Exposed Surfaces in Etched Openings

The substrate is then subject to a solvent clean to remove the etch residues remaining from the etching step used to form the openings in the composite layer, and any residues remaining from the removal of the resist mask. The solvent clean step is carried out using a commercially available solvent such as EKC 265, a hydroxylamine type solvent.

After rinsing, the substrate is placed in an annealing furnace and annealed at from about 350° C. to about 450° C. at atmospheric pressure for a period of from about 30 minutes to about 120 minutes to degasify the materials, including the exposed surfaces of low k dielectric materials.

h. Filling of Openings Etched in Composite Layer

The substrate is then placed in a sputtering chamber and RF cleaned with a cleaning plasma such as an argon plasma or a hydrogen plasma for a period of from about 5 seconds to about 60 seconds.

After this RF cleaning step, a thin layer of an electrically conductive material capable of promoting adherence (a "glue layer") such as titanium is deposited by PVD (sputtered) over the surfaces of the etched openings in the low k dielectric material. A CVD barrier layer of titanium nitride is then formed over the titanium layer in another chamber in the same vacuum chamber. This is contrast to the prior art practice of sputtering a PVD barrier layer of titanium nitride over the newly deposited layer of PVD titanium. The substitution of a CVD barrier layer of titanium nitride, in accordance with the invention, for the prior art PVD barrier layer of titanium nitride has been found to result in less stress than the PVD layer of titanium nitride, thus increasing the rate of successful filling of the openings.

The coated openings are then filled with a conductive metal filler material capable of filling the openings such as aluminum, tungsten, or copper. The resultant substrate with metal-filled openings in low k dielectric material has a reduced number of unfilled or unsatisfactorily filled openings because of the practice of the process steps of the invention.

Having thus described the invention what is claimed is:

1. A process for forming metal-filled openings in low k dielectric material of an integrated circuit structure which comprises:
   a) forming a composite layer of dielectric material over the integrated circuit structure, comprising a barrier layer of dielectric material, a layer of low k dielectric material over the barrier layer, and a capping layer of dielectric material over the layer of low k dielectric material;
   b) forming one or more openings in said composite layer through a mask over said integrated circuit structure by:
      i) forming a photoresist mask over said capping layer of dielectric material;
      ii) baking said photoresist mask in the presence of UV light; and
      iii) etching said composite layer through said photoresist mask;
   c) optionally densifying the newly exposed surfaces of said low k dielectric material;
   d) removing said resist mask using a plasma formed from a non-oxidizing gas;
   e) cleaning said exposed surfaces of said low k dielectric material to remove etch residues;
   f) annealing said low k dielectric material in a furnace to degasify said exposed surfaces of said low k dielectric material;
   g) cleaning said integrated circuit structure in an RF cleaning chamber; and
   h) filling said openings in said low k dielectric material by:
      i) depositing over said surfaces of said etched openings a first layer of an electrically conductive material capable of adhering to said etched surfaces;
      ii) forming a barrier layer of electrically conductive material over said first layer of electrically conductive material; and
      iii) then filling said openings with an electrically conductive metal filler material.

2. The process of claim 1 including the further step of passivating said exposed surfaces of said low k dielectric material with an oxygen plasma after said step of removing said photoresist mask.

3. The process of claim 1 wherein said step of removing said photoresist mask is carried out in the presence of CO gas and in the absence of oxygen gas.

4. The process of claim 1 wherein said step of forming a barrier layer over said first layer of electrically conductive material further comprises forming a CVD titanium nitride barrier layer.

5. The process of claim 1 wherein said photoresist mask is baked in the presence of UV light for a period of at least about 2 minutes at a temperature of at least about 170° C.

6. A process for forming metal-filled openings in low k dielectric material of an integrated circuit structure which comprises:
   a) forming a composite layer of dielectric material over the integrated circuit structure, comprising a barrier layer of dielectric material, a layer of low k dielectric material over the barrier layer, and a capping layer of dielectric material over the layer of low k dielectric material;
   b) forming one or more openings in said composite layer through a mask over said integrated circuit structure by:
      i) forming a photoresist mask over said capping layer of dielectric material;
      ii) baking said photoresist mask; and
      iii) etching said composite layer through said photoresist mask;
   c) optionally densifying the newly exposed surfaces of said low k dielectric material;
   d) removing said photoresist mask using a plasma formed from at least CO and optionally one or more non-oxidizing gases, and in the absence of oxygen;
   e) cleaning said exposed surfaces of said low k dielectric material to remove etch residues;
   f) annealing said low k dielectric material in a furnace to degasify said exposed surfaces of said low k dielectric material;

g) cleaning said integrated circuit structure in an RF cleaning chamber; and h) filling said openings in said low k dielectric material by:
   i) depositing over said surfaces of said etched openings a first layer of an electrically conductive material capable of adhering to said etched surfaces;
   ii) forming a barrier layer of electrically conductive material over said first layer of electrically conductive material; and
   iii) then filling said openings with an electrically conductive metal filler material.

7. The process of claim 6 including the further step of passivating said exposed surfaces of said low k dielectric material with an oxygen plasma after said step of removing said photoresist mask.

8. The process of claim 6 wherein said step of forming a barrier layer over said first layer of electrically conductive material further comprises forming a CVD titanium nitride barrier layer.

9. The process of claim 6 wherein said photoresist mask is baked in the presence of UV light for a period of at least about 2 minutes at a temperature of at least about 170° C.

10. A process for forming metal-filled openings in low k dielectric material of an integrated circuit structure which comprises:
   a) forming a composite layer of dielectric material over the integrated circuit structure, comprising a barrier layer of dielectric material, a layer of low k dielectric material over the barrier layer, and a capping layer of dielectric material over the layer of low k dielectric material;
   b) forming one or more openings in said composite layer through a mask over said integrated circuit structure by:
      i) forming a photoresist mask over said capping layer of dielectric material;
      ii) baking said photoresist mask; and
      iii) etching said composite layer through said photoresist mask;
   c) optionally densifying the newly exposed surfaces of said low k dielectric material;
   d) removing said photoresist mask using a plasma formed from a non-oxidizing gas;
   e) passivating said exposed surfaces of said low k dielectric material with an oxygen plasma;
   f) cleaning said exposed surfaces of said low k dielectric material to remove etch residues;
   g) annealing said low k dielectric material in a furnace to degasify said exposed surfaces of said low k dielectric material;
   h) cleaning said integrated circuit structure in an RF cleaning chamber; and
   j) filling said openings in said low k dielectric material by:
      i) depositing over said surfaces of said etched openings a first layer of an electrically conductive material capable of adhering to said etched surfaces;
      ii) forming a barrier layer of electrically conductive material over said first layer of electrically conductive material; and
      iii) then filling said openings with an electrically conductive metal filler material.

11. The process of claim 10 wherein said step of removing said photoresist mask is carried out in the presence of CO gas and in the absence of oxygen gas.

12. The process of claim 10 wherein said step of forming a barrier layer over said first layer of electrically conductive material further comprises forming a CVD titanium nitride barrier layer.

13. The process of claim 10 wherein said photoresist mask is baked in the presence of UV light for a period of at least about 2 minutes at a temperature of at least about 170° C.

14. A process for forming metal-filled openings in low k dielectric material of an integrated circuit structure which comprises:
   a) forming a composite layer of dielectric material over the integrated circuit structure, comprising a barrier layer of dielectric material, a layer of low k dielectric material over the barrier layer, and a capping layer of dielectric material over the layer of low k dielectric material;
   b) forming one or more openings in said composite layer through a mask over said integrated circuit structure by:
      i) forming a photoresist mask over said capping layer of dielectric material;
      ii) baking said photoresist mask; and
      iii) etching said composite layer through said photoresist mask;
   c) optionally densifying the newly exposed surfaces of said low k dielectric material;
   d) removing said photoresist mask using a plasma formed from a non-oxidizing gas;
   e) cleaning said exposed surfaces of said low k dielectric material to remove etch residues;
   f) annealing said low k dielectric material in a furnace to degasify said exposed surfaces of said low k dielectric material;
   g) cleaning said integrated circuit structure in an RF cleaning chamber; and
   h) filling said openings in said low k dielectric material by:
      i) depositing over said surfaces of said etched openings a first layer of an electrically conductive material capable of adhering to said etched surfaces;
      ii) forming a barrier layer of electrically conductive CVD titanium nitride over said first layer of electrically conductive material; and
      iii) then filling said openings with an electrically conductive metal filler material.

15. The process of claim 14 including the further step of passivating said exposed surfaces of said low k dielectric material with an oxygen plasma after said step of removing said photoresist mask.

16. The process of claim 14 wherein said step of removing said photoresist mask is carried out in the presence of CO gas and in the absence of oxygen gas.

17. The process of claim 14 wherein said photoresist mask is baked in the presence of UV light for a period of at least about 2 minutes at a temperature of at least about 170° C.

18. A process for forming metal-filled openings in low k dielectric material of an integrated circuit structure which comprises:
   a) forming a composite layer of dielectric material over the integrated circuit structure, comprising a barrier layer of dielectric material, a layer of low k dielectric material over the barrier layer, and a capping layer of dielectric material over the layer of low k dielectric material;
   b) forming one or more openings in said composite layer through a mask over said integrated circuit structure by:
      i) forming a photoresist mask over said capping layer of dielectric material;
      ii) baking said photoresist mask in the presence of UV light; and iii) etching said composite layer through said photoresist mask;
c) optionally densifying the newly exposed surfaces of said low k dielectric material;
d) removing said photoresist mask using a plasma formed from a non-oxidizing gas;
e) passivating said exposed surfaces of said low k dielectric material with an oxygen plasma;
f) cleaning said exposed surfaces of said low k dielectric material to remove etch residues;
g) annealing said low k dielectric material in a furnace to degasify said exposed surfaces of said low k dielectric material;
h) cleaning said integrated circuit structure in an RF cleaning chamber; and
j) filling said openings in said low k dielectric material by:
  i) depositing over said surfaces of said etched openings a first layer of an electrically conductive material capable of adhering to said etched surfaces;
  ii) forming a barrier layer of electrically conductive material over said first layer of electrically conductive material; and
  iii) then filling said openings with an electrically conductive metal filler material.

19. A process for forming metal-filled openings in low k dielectric material of an integrated circuit structure which comprises:
a) forming a composite layer of dielectric material over the integrated circuit structure, comprising a barrier layer of dielectric material, a layer of low k dielectric material over the barrier layer, and a capping layer of dielectric material over the layer of low k dielectric material;
b) forming one or more openings in said composite layer through a mask over said integrated circuit structure by:
  i) forming a photoresist mask over said capping layer of dielectric material;
  ii) baking said photoresist mask; and
  iii) etching said composite layer through said photoresist mask;
c) optionally densifying the newly exposed surfaces of said low k dielectric material;
d) removing said photoresist mask using a plasma formed from at least CO and optionally one or more non-oxidizing gases, and in the absence of oxygen;
e) passivating said exposed surfaces of said low k dielectric material with an oxygen plasma;
f) cleaning said exposed surfaces of said low k dielectric material to remove etch residues;
g) annealing said low k dielectric material in a furnace to degasify said exposed surfaces of said low k dielectric material;
h) cleaning said integrated circuit structure in an RF cleaning chamber; and
j) filling said openings in said low k dielectric material by:
  i) depositing over said surfaces of said etched openings a first layer of an electrically conductive material capable of adhering to said etched surfaces;
  ii) forming a barrier layer of electrically conductive material over said first layer of electrically conductive material; and
  iii) then filling said openings with an electrically conductive metal filler material.

20. A process for forming metal-filled openings in low k dielectric material of an integrated circuit structure which comprises:
a) forming a composite layer of dielectric material over the integrated circuit structure, comprising a barrier layer of dielectric material, a layer of low k dielectric material over the barrier layer, and a capping layer of dielectric material over the layer of low k dielectric material;
b) forming one or more openings in said composite layer through a mask over said integrated circuit structure by:
  i) forming a photoresist mask over said capping layer of dielectric material;
  ii) baking said photoresist mask; and
  iii) etching said composite layer through said photoresist mask;
c) optionally densifying the newly exposed surfaces of said low k dielectric material;
d) removing said photoresist mask using a plasma formed from a non-oxidizing gas;
e) passivating said exposed surfaces of said low k dielectric material with an oxygen plasma;
f) cleaning said exposed surfaces of said low k dielectric material to remove etch residues;
g) annealing said low k dielectric material in a furnace to degasify said exposed surfaces of said low k dielectric material;
h) cleaning said integrated circuit structure in an RF cleaning chamber; and
j) filling said openings in said low k dielectric material by:
  i) depositing over said surfaces of said etched openings a PVD layer of titanium metal capable of adhering to said etched surfaces;
  ii) forming a barrier layer of electrically conductive CVD titanium nitride over said titanium metal layer; and
  iii) then filling said openings with an electrically conductive metal filler material selected from the group consisting of aluminum, copper, and tungsten.

* * * * *